(12) United States Patent
Chen

(10) Patent No.: US 7,102,511 B2
(45) Date of Patent: Sep. 5, 2006

(54) RADIO WAVE DETECTION DEVICE

(76) Inventor: Chung-Yang Chen, 3F, No. 2, Lane 497, Chung-Cheng Rd., Hsintien City, Taipei County (TW)

( * ) Notice: Subject to any disclaimer, the term of this patent is extended or adjusted under 35 U.S.C. 154(b) by 106 days.

(21) Appl. No.: 10/979,250

(22) Filed: Nov. 3, 2004

(65) Prior Publication Data

US 2006/0092017 A1    May 4, 2006

(51) Int. Cl.
*G08B 1/08* (2006.01)
*H04Q 7/00* (2006.01)

(52) U.S. Cl. .............................. 340/539.21; 455/226.2; 455/226.4; 455/67.7; 340/539.23

(58) Field of Classification Search .. 340/691.1–691.6, 340/539.32, 539.21, 539.23; 455/421, 513, 455/67.7, 566, 115.3, 115.4, 425; 342/118, 342/119, 458, 176
See application file for complete search history.

(56) References Cited

U.S. PATENT DOCUMENTS

| | | | | | |
|---|---|---|---|---|---|
| 3,774,113 | A | * | 11/1973 | Chasek ..................... | 455/226.4 |
| 4,578,820 | A | * | 3/1986 | Highton .................... | 455/226.2 |
| 5,390,365 | A | * | 2/1995 | Enoki et al. ............. | 455/553.1 |
| 5,564,099 | A | * | 10/1996 | Yonekura et al. ........... | 455/318 |
| 5,630,210 | A | * | 5/1997 | Marry et al. .............. | 455/67.13 |
| 5,839,060 | A | * | 11/1998 | Kasperkovitz et al. ... | 455/226.2 |
| 5,873,046 | A | * | 2/1999 | Bronner ................... | 455/553.1 |
| 5,912,922 | A | * | 6/1999 | Koszarsky et al. ......... | 375/224 |
| 6,144,858 | A | * | 11/2000 | Masuda ................... | 455/456.3 |

* cited by examiner

*Primary Examiner*—Jeffery Hofsass
*Assistant Examiner*—Hoi C. Lau
(74) *Attorney, Agent, or Firm*—Troxell Law Office, PLLC

(57) ABSTRACT

A radio wave detection device including an electric wave receiving/amplifying circuit, a rectifying circuit, a peak-to-peak amplifier, a central processor, a power supply, a reference resistance circuit and a sound/light output unit. The electric wave receiving/amplifying circuit includes an antenna for receiving radio signal in the environment. The radio wave with a specific frequency filters through a wave filter and then is amplified. The rectifying circuit converts the radio signal into analog level voltage which is output to the central processor and peak-to-peak amplifier. In a preset condition, the peak-to-peak amplifier converts the level voltage into a controlling signal which is output to the central processor. The central processor also receives various comparison level voltages generated by the reference resistance circuit and compares the reference level voltage with the level voltage (and the controlling signal). Thereafter, the intensity of the detected radio signal is shown by the sound/light output unit by way of light and sound.

24 Claims, 4 Drawing Sheets

RADIO WAVE DETECTION DEVICE

BACKGROUND OF THE INVENTION

The present invention is related to an improved radio wave detection device, and more particularly to a radio wave detection device which is able to effectively detect the existence of various radio waves and truly show the pattern and intensity of the radio waves to a user.

Wireless telecommunication, wireless network and other wireless signal transmissions are widely used in modern life. All these wireless equipments transmit signals via electric wave. The intensity of the radio wave (carrier wave) will directly affect the quality of the transmission of radio signal.

A conventional radio detection device can be used to detect the environmental radio wave and avoid unauthorized shooting. Such radio detection device has a simple inductor (antenna) for receiving the environmental electricwave and an amplifier (OPAMP) for amplifying the electric wave. Such radio detection device has poor sensitivity and can only find out whether there is electric wave in the environment. However, it is impossible for such radio detection device to truly detect the intensity of the electric wave.

Also, the intensity of the radio signal can be shown on the panel of a mobile phone. The integrated circuit and structure of such mobile phone are quite complicated so that the cost is high. In addition, only the intensity of the carrier wave (radio wave at specific frequency) for transmitting the signal of the mobile phone can be detected. Such mobile phone cannot serve as a general radio detection device.

SUMMARY OF THE INVENTION

It is therefore a primary object of the present invention to provide an improved radio wave detection device including an electric wave receiving/amplifying circuit, a rectifying circuit, a peak-to-peak amplifier, a central processor, a power supply, a reference resistance circuit and a sound/light output unit. The electric wave receiving/amplifying circuit includes an antenna for receiving radio signal in the environment. The radio signal is amplified and output to the rectifying circuit which converts the radio signal into analog level voltage. The central processor receives the level voltage and compares the level voltage with various comparison level voltages generated by the reference resistance circuit. Thereafter, the intensity of the detected radio signal is shown by the sound/light output unit by way of light and sound.

It is a further object of the present invention to provide the above radio wave detection device in which a wave filter is disposed in the electric wave receiving/amplifying circuit. Only the signal with a preset frequency can filter through the wave filter. A peak-to-peak amplifier is additionally disposed between the rectifying circuit and the central processor. The peak-to-peak amplifier serves to receive the level voltage output by the rectifying circuit and output a controlling signal to the central processor so as to detect the intensity of the radio wave with a specific frequency such as 2.4 G wireless network electric wave.

The present invention can be best understood through the following description and accompanying drawings wherein:

DETAILED DESCRIPTION OF THE PREFERRED EMBODIMENTS

Figure 1:
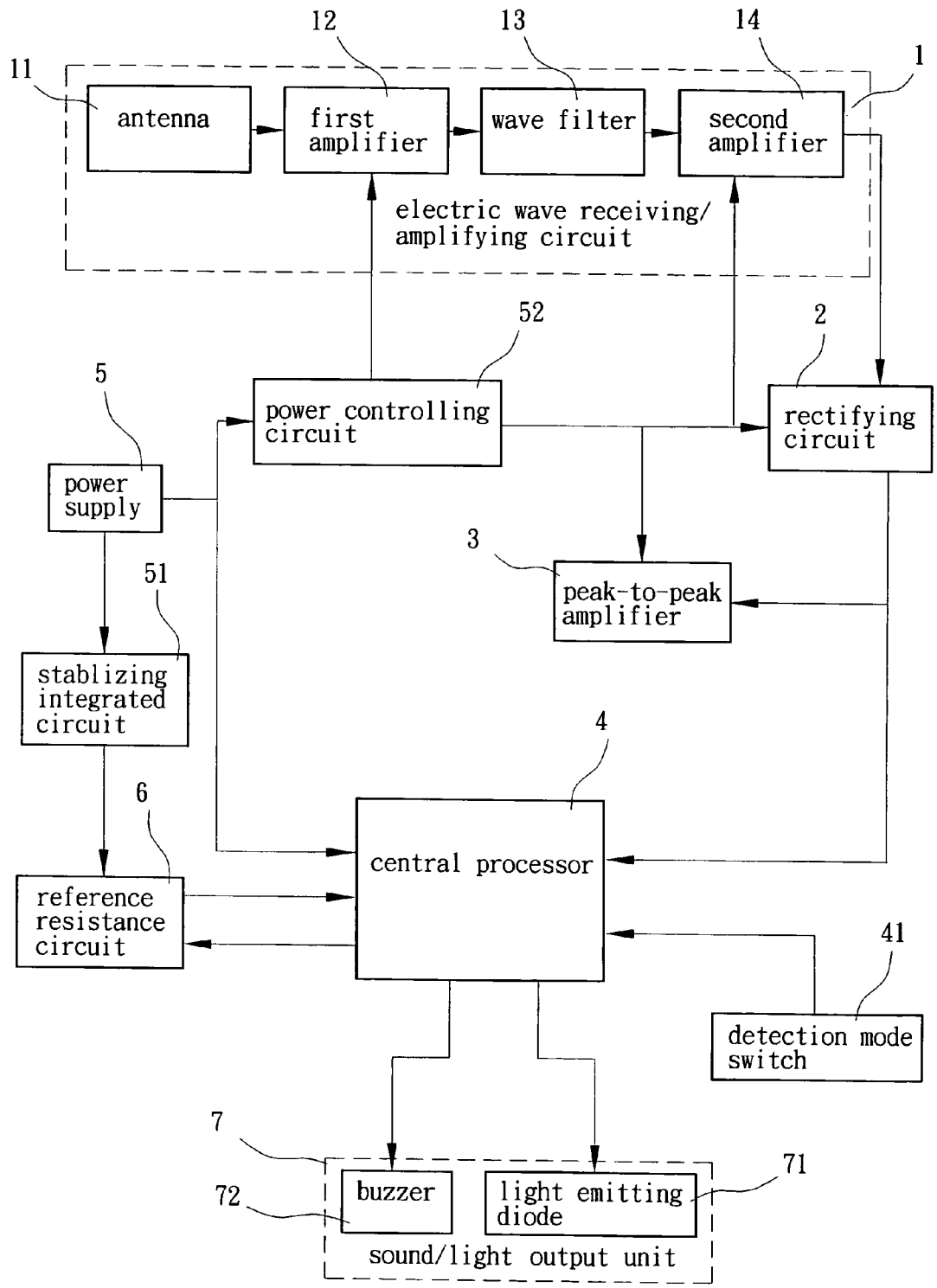
FIG. 1 is a block circuit diagram of a first embodiment of the present invention.

Please refer to FIG. 1 which is a block circuit diagram of a first embodiment of the present invention. The first embodiment includes an electric wave receiving/amplifying circuit 1, a rectifying circuit 2, a peak-to-peak amplifier 3, a central processor 4, a power supply 5, a reference resistance circuit 6 and a sound/light output unit 7. The electric wave receiving/amplifying circuit 1 is composed of an antenna 11, a first amplifier 12, a wave filter 13 and a second amplifier 14. An input terminal of the rectifying circuit 2 is connected with an output terminal of the second amplifier 14. An output terminal of the rectifying circuit 2 is connected with an input terminal of the peak-to-peak amplifier 3 and an input terminal of the central processor. An output terminal of the peak-to-peak amplifier 3 is connected with another input terminal of the central processor 4. The power supply 5 is connected with a stabilizing integrated circuit 51, a power controlling circuit 52 and the central processor 4. The power controlling circuit 52 is controlled by the central processor 4 to provide power for the first amplifier 12, second amplifier 14, rectifying circuit 2 and peak-to-peak amplifier 3. The stabilizing integrated circuit 51 is connected with the reference resistance circuit 6 in which multiple serially connected resistors are disposed. The output terminal of the stabilizing integrated circuit 51 provides a stable voltage to create voltage drop between two ends of the resistors with different resistances so as to form different reference voltages. The different reference voltages provide various necessary comparison level voltages for the central processor 4. The central processor 4 is connected with a detection mode switch 41. An output terminal of the central processor 4 is connected with the sound/light output unit 7 in which multiple light-emitting diodes 71 and a buzzer 72 are disposed for showing the intensity of the detected electric wave by way of light and sound.

When the detection mode switch 41 is switched to a mode for avoiding authorized shooting, the antenna 11 receives the electric wave in the environment and inputs the signal into the first amplifier 12 for preliminary amplification. The second amplifier 14 further amplifies the signal (without going through the wave filter 13). This is because the electric wave signal of the unauthorized shooting is not unifrequency. Then the signal is output to the rectifying circuit 2 which converts the signal into analog level voltage. The level voltage is output to the central processor 4. The central processor 4 can select a suitable reference level voltage according to the voltage variation of the power supply 5 and compare the selected reference level voltage with the level voltage output by the rectifying circuit 2. After compared, the result of detection is shown by the sound/light output unit 7. The number of the lighting light-emitting diodes 71 and the tempo of the sound emitted by the buzzer 72 indicate the intensity of the detected electric wave.

When the detection mode switch 41 is switched to a mode for detecting 2.4 G wireless network electric wave, the antenna 11 receives the electric wave in the environment and inputs the signal into the first amplifier 12 for preliminary amplification. The signal with other frequency is filtered off by the wave filter 13 and only the 2.4 G wireless network electric wave can filter through the wave filter 13. The second amplifier 14 further amplifies the signal and then outputs the signal to the rectifying circuit 2 which converts the signal into level voltage. The level voltage is output to the central processor 4 and the peak-to-peak amplifier 3. The peak-to-peak amplifier 3 detects the 2.4 G wireless network electric wave signal and properly amplifies the signal and then outputs a controlling signal to the central processor 4. The central processor 4 can select a suitable reference level voltage according to the voltage variation of the power supply 5 and compare the selected reference level voltage with the level voltage output by the rectifying circuit 2 and the controlling signal of the peak-to-peak amplifier 3. After compared, the result of detection is shown by the sound/light output unit 7. The number of the lighting light-emitting diodes 71 indicates the intensity of the detected 2.4 G wireless network electric wave.

Figure 2:
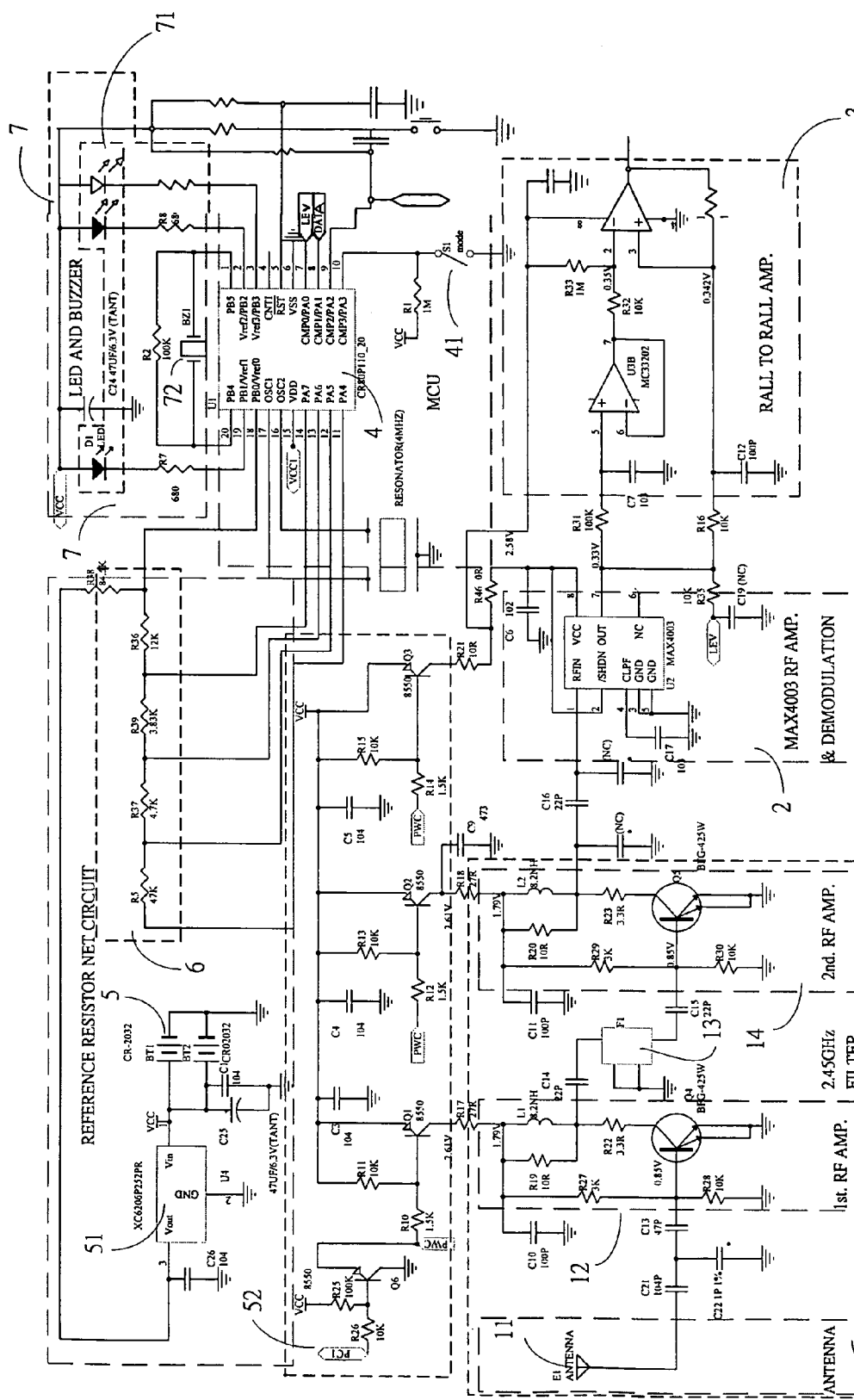
FIG. 2 is a circuit diagram of the first embodiment of the present invention.

FIG. 2 is a circuit diagram of the first embodiment of the present invention. The actual circuit structure can be modified according to the necessary specification and characteristics. However, the main structure is unchanged.

Figure 3:
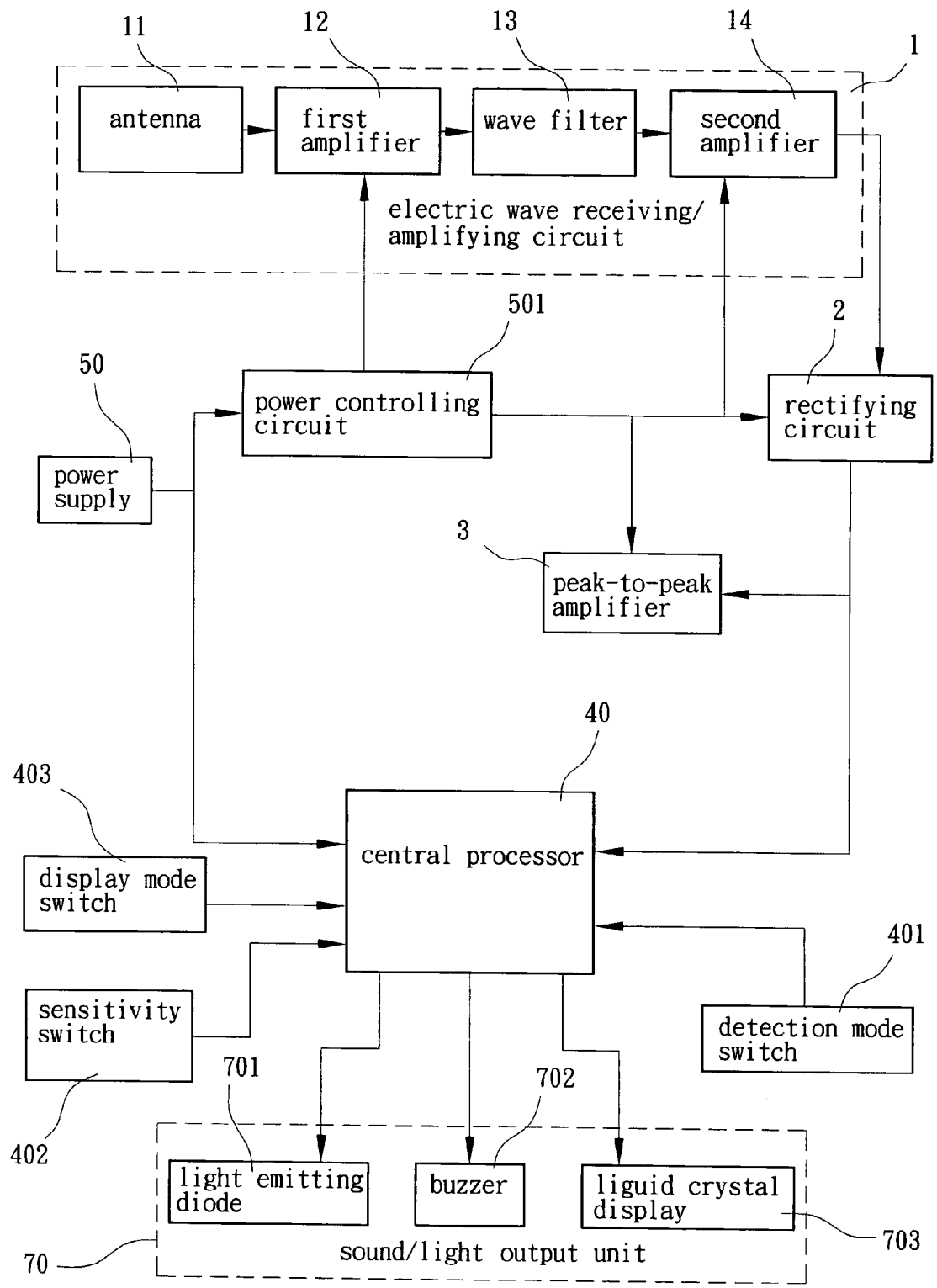
FIG. 3 is a block circuit diagram of a second embodiment of the present invention.

Please refer to FIG. 3 which is a block circuit diagram of a second embodiment of the present invention. The second embodiment includes an electric wave receiving/amplifying circuit 1, a rectifying circuit 2, a peak-to-peak amplifier 3, a central processor 40, a power supply 50 and a sound/light output unit 70. The electric wave receiving/amplifying circuit 1, rectifying circuit 2 and peak-to-peak amplifier 3 are identical to those of the first embodiment. The central processor 40 is connected with a detection mode switch 403, a sensitivity switch 402 and a display mode switch 403. The detection mode switch 401 serves to control the detection mode. The display mode switch 403 serves to control display element. The sensitivity switch 402 serves to control the sensitivity of detection. The power supply 5 is connected with a power controlling circuit 501 and the central processor 40. The power controlling circuit 501 is controlled by the central processor 40 to provide power for the first amplifier 12, second amplifier 14, rectifying circuit 2 and peak-to-peak amplifier 3. A monitoring and automatically adjustable reference voltage is set in the central processor 40 to form a suitable comparison level voltage in the central processor 40. The sound/light output unit 70 is connected with the output terminal of the central processor 40. In the sound/light output unit 70 are disposed multiple light-emitting diodes 70, a buzzer 702 and a liquid crystal display 703 for showing the intensity of the detected electric wave by way of light, panel and sound.

When the detection mode switch 41 is switched to a preset electric wave detection mode, the sensitivity switch 402 is positioned in a suitable sensitivity position and the display mode switch 403 is positioned in a correct position, the antenna 11 of the electric wave receiving/amplifying circuit 1 receives the electricwave in the environment and inputs the signal into the first amplifier 12 for preliminary amplification. The signal with other frequency is filtered off by the wave filter 13. (This can be directly omitted.) Only the 2.4 G wireless network electric wave can filter through the wave filter 13. The second amplifier 14 further amplifies the signal and then outputs the signal to the rectifying circuit 2 which converts the signal into level voltage. The level voltage is output to the central processor 40 and the peak-to-peak amplifier 3. (In the case that the electric signal does not go through the wave filter 13, the peak-to-peak amplifier 3 will no work.) The peak-to-peak amplifier 3 detects the 2.4 G wireless network electric wave signal and properly amplifies the signal and then outputs a controlling signal to the central processor 40. The central processor 40 compares the internal automatically created comparison level voltage with the level voltage output by the rectifying circuit 2 and the controlling signal of the peak-to-peak amplifier 3. After compared, the result of detection is shown by the sound/light output unit 7. The intensity of the detected 2.4 G wireless network electric wave is indicated by the number of the lighting light-emitting diodes 71 or directly shown by words and pictures of the liquid crystal display 703 in cooperation with the tempo of the sound emitted by the buzzer 702.

Figure 4:
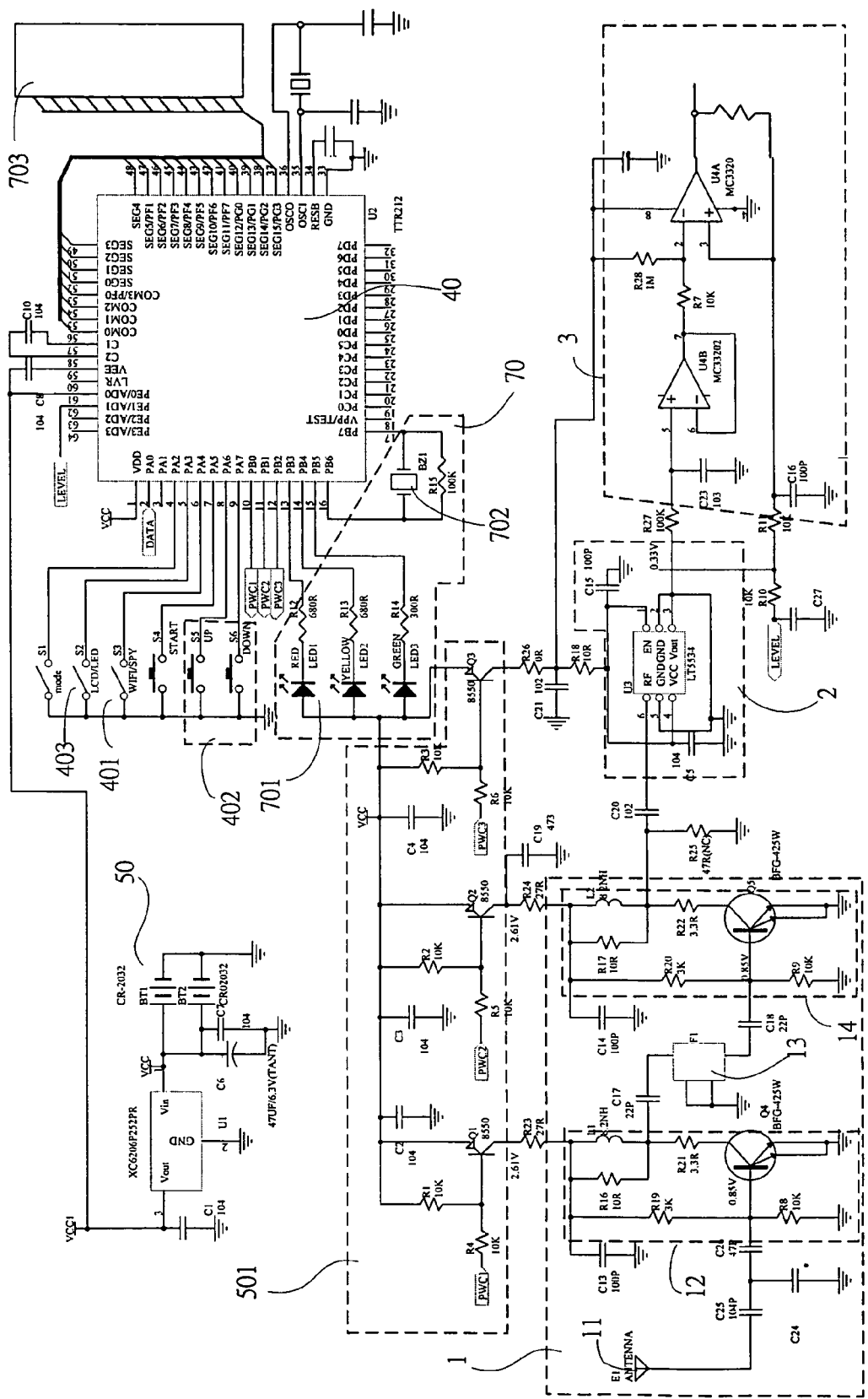
FIG. 4 is a circuit diagram of the second embodiment of the present invention.

FIG. 4 is a circuit diagram of the second embodiment of the present invention, which is similar to that of the first embodiment. The actual circuit structure can be modified according to the necessary specification and characteristics. However, the main structure needs to meet the regulation of the block circuit diagram of FIG. 3.

According to the above arrangements, the radio wave detection device of the present invention can truly and stably detect the radio wave without limitation of frequency or within a preset range of frequency.

The above embodiments are only used to illustrate the present invention, not intended to limit the scope thereof. Many modifications of the above embodiments can be made without departing from the spirit of the present invention.

What is claimed is:

1. A radio wave detection device comprising:
   an electric wave receiving/amplifying circuit including an antenna for receiving electric wave signal in the environment, a first amplifier and a second amplifier, the received electric wave signal being preliminarily amplified by the first amplifier and further amplified by the second amplifier and then output;
   a rectifying circuit connected with the second amplifier of the electric wave receiving/amplifying circuit for receiving the output signal and converting the signal into analog level voltage, the level voltage being then output;
   a power supply for providing power to the respective components of the detection device;
   a reference resistance circuit composed of multiple serially connected resistors with different resistances, a stabilizing integrated circuit of the power supply outputting a stable voltage to the reference resistance circuit so as to create voltage drop between two ends of the resistors and form different reference level voltages; and
   a central processor to which the reference level voltages are output, the central processor serving to select a suitable reference level voltage on the basis of the voltage of the power supply and compare the selected reference level voltage with the level voltage output by the rectifying circuit, whereby after compared, the result of detection is shown by a sound/light output unit by way of light and sound.

2. The radio wave detection device as claimed in claim 1, wherein a wave filter is disposed between the first and second amplifiers of the electric wave receiving/amplifying circuit for filtering off signals with frequencies other than 2.4 G wireless network electricwave, an output terminal of the rectifying circuit being connected with a peak-to-peak amplifier for receiving the level voltage output by the rectifying circuit and converting the level voltage into a controlling signal which is output to the central processor, the central processor serving to compare the controlling signal with the reference level voltage so as to detect the wireless network electric wave with specific frequency.

3. The radio wave detection device as claimed in claim 2, wherein the central processor is equipped with a detection mode switch for switching the detection device between a mode for detecting electric wave with a specific frequency and a mode for detecting electric wave without limitation of frequency.

4. The radio wave detection device as claimed in claim 1, wherein sound/light output unit includes multiple light-emitting diodes, whereby the number of lighting light-emitting diodes indicates the intensity of the detected signal.

5. The radio wave detection device as claimed in claim 2, wherein sound/light output unit includes multiple light-emitting diodes, whereby the number of lighting light-emitting diodes indicates the intensity of the detected signal.

6. The radio wave detection device as claimed in claim 3, wherein sound/light output unit includes multiple light-emitting diodes, whereby the number of lighting light-emitting diodes indicates the intensity of the detected signal.

7. The radio wave detection device as claimed in claim 1, wherein the sound/light output unit includes a liquid crystal display for directly showing the intensity of the detected signal.

8. The radio wave detection device as claimed in claim 2, wherein the sound/light output unit includes a liquid crystal display for directly showing the intensity of the detected signal.

9. The radio wave detection device as claimed in claim 3, wherein the sound/light output unit includes a liquid crystal display for directly showing the intensity of the detected signal.

10. The radio wave detection device as claimed in claim 1, wherein the sound/light output unit includes a buzzer, whereby the tempo of the sound emitted by the buzzer indicates the intensity of the detected signal.

11. The radio wave detection device as claimed in claim 2, wherein the sound/light output unit includes a buzzer, whereby the tempo of the sound emitted by the buzzer indicates the intensity of the detected signal.

12. The radio wave detection device as claimed in claim 3, wherein the sound/light output unit includes a buzzer, whereby the tempo of the sound emitted by the buzzer indicates the intensity of the detected signal.

13. The radio wave detection device as claimed in claim 1, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

14. The radio wave detection device as claimed in claim 2, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

15. The radio wave detection device as claimed in claim 3, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

16. The radio wave detection device as claimed in claim 4, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

17. The radio wave detection device as claimed in claim 5, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

18. The radio wave detection device as claimed in claim 6, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

19. The radio wave detection device as claimed in claim 7, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

20. The radio wave detection device as claimed in claim 8, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

21. The radio wave detection device as claimed in claim 9, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

22. The radio wave detection device as claimed in claim 10, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

23. The radio wave detection device as claimed in claim 11, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

24. The radio wave detection device as claimed in claim 12, wherein a power controlling circuit is disposed at output terminal of the power supply and controlled by the central processor, the power controlling circuit serving to provide optimal power for the electric wave receiving/amplifying circuit, rectifying circuit and peak-to-peak amplifier.

* * * * *